United States Patent
Bang

(10) Patent No.: US 8,022,493 B2
(45) Date of Patent: Sep. 20, 2011

(54) IMAGE SENSOR AND MANUFACTURING METHOD THEREOF

(75) Inventor: Sun Kyung Bang, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 570 days.

(21) Appl. No.: 12/212,134

(22) Filed: Sep. 17, 2008

(65) Prior Publication Data

US 2009/0085135 A1    Apr. 2, 2009

(30) Foreign Application Priority Data

Sep. 27, 2007   (KR) .................. 10-2007-0097281

(51) Int. Cl.
*H01L 31/00* (2006.01)
*H01L 27/146* (2006.01)

(52) U.S. Cl. .......... 257/440; 438/74; 257/294; 257/444; 257/448; 257/233; 257/E31.055; 257/E31.127

(58) Field of Classification Search .................. 438/74; 257/294, 440, 444, 448, 233, E31.055, E31.127
See application file for complete search history.

(56) References Cited

U.S. PATENT DOCUMENTS

| 7,217,983 B2* | 5/2007 | Suzuki | 257/444 |
| 7,411,620 B2* | 8/2008 | Taniguchi et al. | 348/294 |
| 7,550,813 B2* | 6/2009 | Suzuki | 257/440 |

FOREIGN PATENT DOCUMENTS

| KP | 1020050117674 | 12/2005 |
| KP | 1020060120260 | 11/2006 |

* cited by examiner

*Primary Examiner* — Matthew Landau
*Assistant Examiner* — Jessica Hall
(74) *Attorney, Agent, or Firm* — Saliwanchik, Lloyd & Eisenschenk

(57) ABSTRACT

Provided are embodiments of an image sensor. The image sensor can comprise a first substrate including a transistor circuit, a lower interconnection layer, an upper interconnection layer, and a second substrate including a vertical stacked photodiode. The lower interconnection layer is disposed on the first substrate and comprises a lower interconnection connected to the transistor circuit. The upper interconnection layer is disposed on the lower interconnection layer and comprises an upper interconnection connected with the lower interconnection. The vertical stacked photodiode can be disposed on the upper interconnection layer and connected with the upper interconnection through, for example, a single plug connecting a blue, green, and red photodiode of the vertical stack or a corresponding plug for each of the blue, green, and red photodiode of the vertical stack.

2 Claims, 5 Drawing Sheets

IMAGE SENSOR AND MANUFACTURING METHOD THEREOF

CROSS-REFERENCE TO RELATED APPLICATION

The present application claims the benefit under 35 U.S.C. §119 of Korean Patent Application No. 10-2007-0097281, filed Sep. 27, 2007, which is hereby incorporated by reference in its entirety.

BACKGROUND

An image sensor is a semiconductor device for converting an optical image into an electrical signal. The image sensor is roughly classified as a charge coupled device (CCD) image sensor or a complementary metal oxide semiconductor (CMOS) image sensor (CIS).

The CIS includes photodiodes and MOS transistors in a unit pixel, and sequentially detects electrical signals of respective unit pixels in a switching manner to realize an image. Particularly, the unit pixel of a typical CIS includes a photodiode region receiving a light signal to convert the light signal into an electrical signal and a transistor region processing this electrical signal.

In a horizontal CMOS image sensor, the photodiode and the transistor are horizontally formed adjacent to each other on a substrate. Accordingly, an additional region for a photodiode is required on the substrate for each unit pixel, which reduces a fill factor and limits possibility of resolution.

BRIEF SUMMARY

Embodiments of the present invention provide an image sensor that can provide vertical integration of a transistor circuit and a photodiode, and a manufacturing method thereof.

In one embodiment, an image sensor can comprise: a first substrate comprising a transistor circuit; a lower interconnection layer on the first substrate, the lower interconnection layer comprising a lower interconnection; an upper interconnection layer on the lower interconnection layer, the upper interconnection layer comprising an upper interconnection connected with the lower interconnection; and a second substrate on the upper interconnection layer, the second substrate comprising a photodiode, wherein the photodiode is connected with the upper interconnection. According to embodiments, the photodiode can be formed having a vertical stacked structure of red, green, and blue photodiodes for each unit pixel.

In another embodiment, a method for manufacturing an image sensor can comprise: forming a transistor circuit on a first substrate; forming a lower interconnection layer on the first substrate such that the lower interconnection layer comprises a lower interconnection connected with the transistor circuit; forming a vertical type photodiode comprising red, green, and blue photodiodes on a second substrate; and bonding the second substrate comprising the vertical type photodiode on the lower interconnection layer.

The details of one or more embodiments are set forth in the accompanying drawings and the description below. Other features will be apparent from the description and drawings, and from the claims.

DETAILED DESCRIPTION

Embodiments of an image sensor and a manufacturing method thereof are described in detail with reference to the accompanying drawings.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 9:
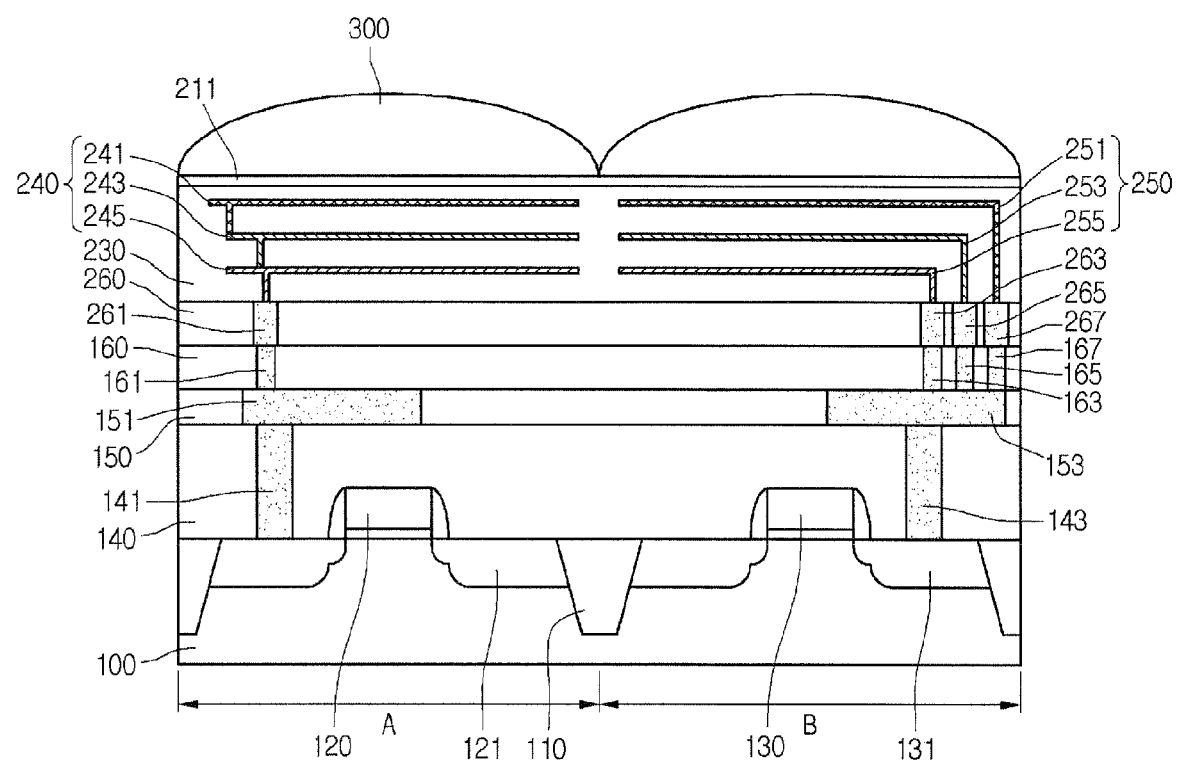

FIG. 9 is a cross-sectional view of an image sensor according to an embodiment.

Referring to FIG. 9, a second substrate 211 including photodiodes 240 and 250 can be disposed on a first substrate 100 including transistors 120 and 130 respectively arranged in unit pixels A and B.

The first substrate 100 can be a single crystal silicon substrate, and can be a p-type impurity or n-type impurity doped substrate.

A device isolation layer 110 defining an active region and a field region can be formed in the first substrate 100. The device isolation layer 100 can be a shallow trench isolation (STI) region.

The transistor 120 (130) formed in the first substrate 100 for each unit pixel A (B) can be arranged in accordance with a transistor circuit. The transistor circuit can be, for example, a 3Tr-type, 4-Tr-type, etc. In an embodiment of 4Tr-type, the transistor circuit can include a transfer transistor, a reset transistor, a drive transistor, and a select transistor, which are connected to the photodiode 240 to convert a received photo charge into an electrical signal.

Each transistor 120 (130) can include a gate dielectric, a gate electrode, spacers, a lightly doped drain (LDD) region, and a source/drain region 121 (131).

A lower interconnection layer can be disposed on the first substrate 100 including the transistors 120 and 130.

The lower interconnection layer can include a dielectric and a plurality of lower interconnections passing through the dielectric. The lower interconnection layer can be provided as a multilayer. For example, the lower interconnection layer can include a first dielectric 140, a second dielectric 150, and a third dielectric 160. First interconnections (141 and 143), second interconnections (151 and 153), and third interconnections (161, 163, 165, and 167) can be disposed in respective ones of the first to third dielectrics 140, 150, and 160 for connecting the transistors 120 and 130 with the photodiodes 240 and 250. The third interconnections can be arranged electrically connected to the second interconnections for each unit pixel in numbers depending on the structure of the photodiode 240 (250).

The photodiode 240 (250) can be formed on a second substrate and arranged according to each unit pixel A (B).

The second substrate can include a low concentration p-type epitaxial layer 211 and a second epitaxial layer 230. A vertical type (or stacked) photodiode 240 (250) can be formed inside the second epitaxial layer 230 for each unit pixel A (B).

The photodiode 240 (250) can be formed by sequentially forming a blue photodiode 241 (251), a green photodiode 243 (253), and a red photodiode 245 (255) on the second substrate.

The figures illustrate two implementations of a photodiode in accordance with embodiments of the present invention. In one implementation, the photodiode 240 formed in the unit pixel A can be formed in a structure where red, green, and blue photodiodes 241, 243, and 245 are connected with each other within the second substrate. In another implementation, the photodiode 250 formed in the unit pixel B can be formed in a structure where red, green, and blue photodiodes 251, 253, and 255 are separated by respective plugs. In one embodiment, the unit pixels of an image sensor can include both photodiode arrangements. For example, unit pixel A can be formed with the photodiode 240 and unit pixel B can be formed with the photodiode 250, or vice-versa. In another embodiment, photodiodes formed in the unit pixels A and B can be formed having the same structures. For example, unit pixels A and B can each be formed with the photodiodes 240, or alternatively, unit pixels A and B can each be formed with the photodiodes 250.

An upper interconnection layer can be disposed between the second epitaxial layer 230 including the photodiodes 240 and 250 and the third dielectric 160 including the third interconnections 161, 163, 165, and 167. The upper interconnection can include a dielectric 260 and upper interconnections 261, 263, 265, and 267. The upper interconnection layer is designed for connecting the photodiodes 240 and 250 with the transistors 120 and 130 formed in the unit pixels A and B. One or more upper interconnections 261, 263, 265, and 267 can be formed depending on the structure of the photodiodes 240 and 250.

In a further embodiment, microlenses 300 can be disposed on the photodiodes 240 and 250 in the unit pixels A and B.

By providing a vertical stacked photodiode, color filters can be omitted. In addition, the vertical integration of the photodiode and the transistor circuitry can improve the fill factor such that it can approach about 100%.

A method for manufacturing an image sensor according to an embodiment will be described with reference to FIGS. 1 to 9.

Figure 1:
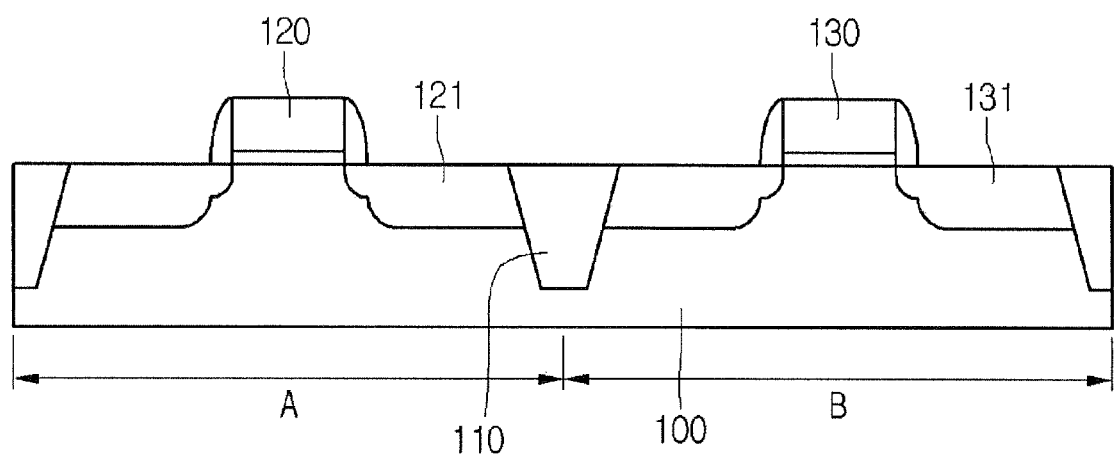
FIGS. 1 to 9 are views illustrating a process for manufacturing an image sensor according to an embodiment of the present invention.

Referring to FIG. 1, transistors 120 and 130 can be formed on a first substrate 100 and arranged according to unit pixels A and B.

The first substrate 100 can be a single crystal silicon substrate, and can be a substrate doped with p-type impurities or n-type impurities.

A device isolation layer 110 can be formed in the first substrate 100 to define an active region and a field region. The device isolation layer 110 can be a shallow trench isolation (STI) region.

To form the unit pixels A and B in the active region of the first substrate 100, a transistor circuit including the transistors 120 and 130 can be formed. In one embodiment, the transistor circuits can include a transfer transistor, a reset transistor, a drive transistor, and a select transistor.

According to one method for forming the transistor circuits, to form the transistors 120 and 130, an oxide layer and a polysilicon layer can be stacked in the active region of the first substrate 100, and a gate dielectric and a gate electrode can be formed from the oxide layer and the polysilicon layer using an etching process.

Next, a lightly doped drain (LDD) region can be formed in the first substrate 100 by ion implantation of low concentration dopants (n-type or P-type impurities) using the gate electrode as a mask. Also, sidewall spacers contacting sidewalls of the gate electrode can be formed, for example, by depositing a dielectric on the entire surface of the first substrate 100 including the gate electrode, and performing a blanket etching on the dielectric.

Source/drain regions 121 and 131 connected to the LDD region can be formed through ion implantation of high concentration dopants (n-type or P-type impurities) using the gate electrode and the spacers as a mask. Additionally, heat treatment can be performed to activate dopants implanted into the source/drain regions 121 and 131.

Figure 2:
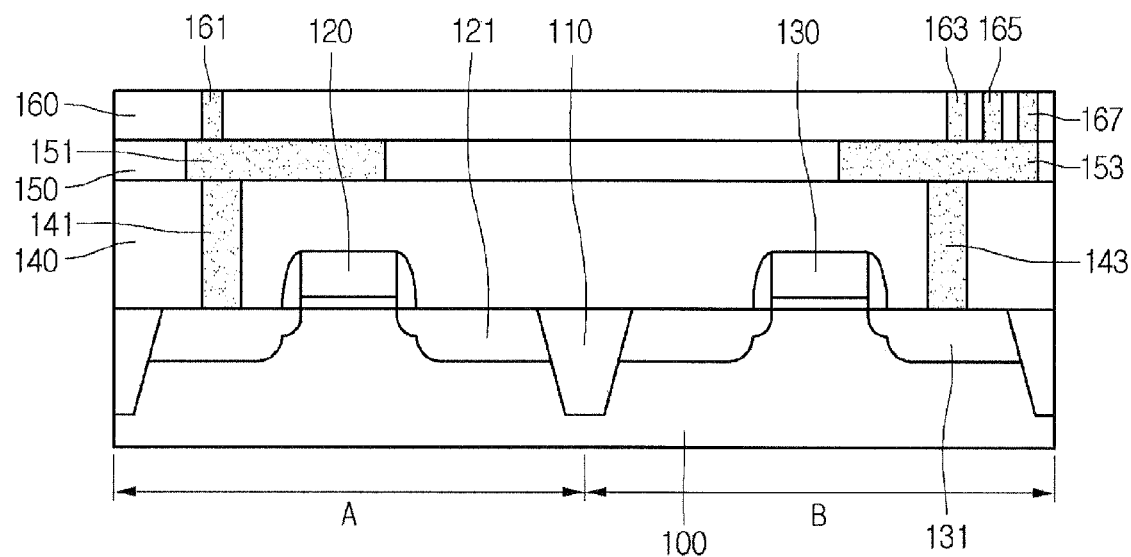

Referring to FIG. 2, a plurality of lower interconnection layers can be formed on the first substrate 100.

The lower interconnection layer can include dielectric and lower interconnections passing through the dielectric. The dielectric 140 can include an oxide layer, a nitride layer, or a combination of an oxide layer and a nitride layer. In addition, the lower interconnections can be formed of various conductive materials including metal, alloy, and silicide. For example, the lower interconnections can be formed of aluminum, copper, cobalt, or tungsten.

The dielectric of the lower interconnection layer can be formed in a plurality of layers, and a plurality of lower interconnections can be provided. In an embodiment, a first dielectric 140 can be formed on the substrate and a first interconnection 141 (143) can be provided in the first dielectric 140 electrically connected to a source/drain region 121 (131) of the transistor 120 (130) for each unit pixel A (B). Then, a second dielectric 150 can be formed on the first dielectric 140, and a second interconnection 151 (153) connected with the first interconnection 141 (143) can be formed in the second dielectric 150. Next, a third dielectric 160 can be formed on the second dielectric 150. According to one embodiment, a third interconnection 161 connected with the second interconnection 151 can be formed in the third dielectric 160. The third interconnection can electrically connect a photodiode to the second interconnection for a unit pixel. In one implementation, a single third interconnection 161 can be used to connect a photodiode to the second interconnection 151. In another implementation a plurality of third interconnections can be used in a unit pixel. For example, three third interconnections 163, 165, and 167 can be used to electrically connect a photodiode to the second interconnection 153. The number of third interconnections can depend on the structure of the photodiode. In one embodiment, one third interconnection 161 can be used for a first unit pixel A and three third interconnections 163, 165, and 167 can be used for a second unit pixel B. In another embodiment, respective ones of a third interconnection 161 can be used for the first unit pixel A and the second unit pixel B. In yet another embodiment, respective three third interconnections 163, 165, and 167 can be used for the first unit pixel A and the second unit pixel B.

Figure 3:
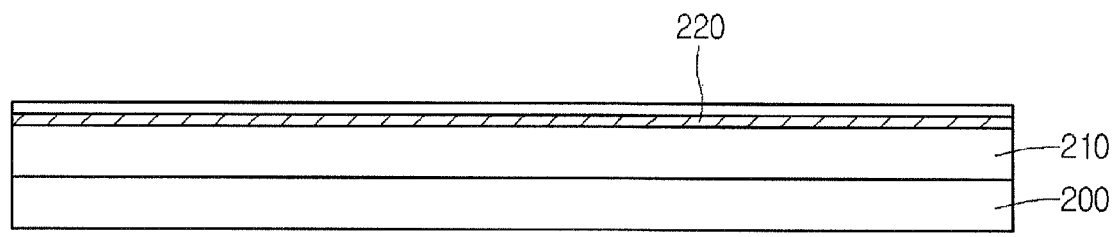

Referring to FIG. 3, a barrier layer 220 can be formed on a second semiconductor substrate 200.

The second semiconductor substrate 200 can be a single silicon substrate, and can be a substrate doped with p-type impurities or n-type impurities. In an embodiment, the second semiconductor substrate 200 can be a high concentration p-type (P++) substrate, and a first low concentration p-type epitaxial layer (p-epi) 210 can be formed on the second semiconductor substrate 200.

The barrier layer 220 can be formed inside the first epitaxial layer 210 through an ion implantation process. For example, the barrier layer 220 can be formed by implanting nitrogen ions. Since the barrier layer 220 is formed inside the first epitaxial layer 210, the upper surface of the first epitaxial layer can be exposed.

Figure 4:
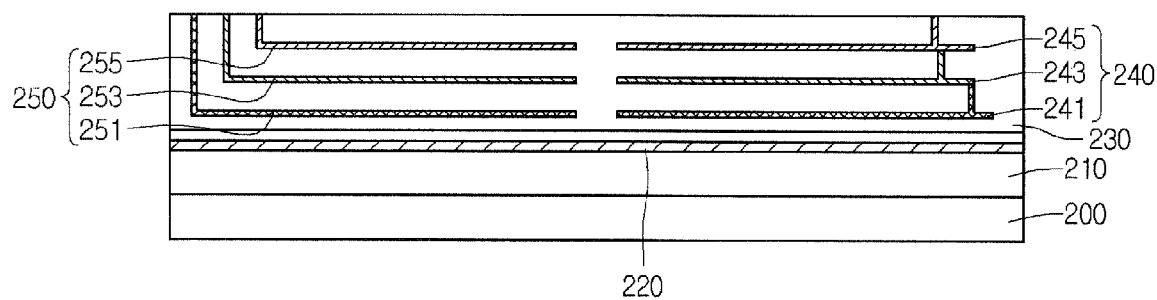

Referring to FIG. 4, photodiodes 240 and 250 can be formed on the second semiconductor substrate 200.

Each of the photodiodes 240 and 250 can be a vertical type photodiode including a red photodiode, a green photodiode, and a blue photodiode. Since the vertical type photodiode 240 (250) includes three color photodiodes vertically arranged in one pixel, it can realize higher image quality than that of a horizontal type image sensor. Also, since the vertical type photodiode 240 (250) does not require a separate color filter process, productivity can be increased and manufacturing costs can be reduced.

A method for manufacturing the photodiodes 240 and 250 is described below.

A second epitaxial layer can be formed on the first epitaxial layer 210 on the second semiconductor substrate 200. Then, the blue photodiodes 241 and 251 can be formed by implanting n-type impurities such as arsenic (As) into the second epitaxial layer 230.

A third epitaxial layer can be formed on the second epitaxial layer 230. Then, the green photodiodes 243 and 253 can be formed by implanting n-type impurities into the third epitaxial layer.

A fourth epitaxial layer can be formed on the third epitaxial layer. Then, the red photodiodes 245 and 255 can be formed by implanting n-type impurities into the fourth epitaxial layer.

The second, third, and fourth epitaxial layers can be formed of the same material, and can be referred to as the epitaxial layer 230.

Accordingly, the blue photodiodes 241 and 251, the green photodiodes 243 and 253, and the red photodiodes 245 and 255 are sequentially formed inside the epitaxial layer 230.

According to one embodiment, the blue photodiode 241 of the photodiode 240 can be connected with the green photodiode 243 via a plug, and the green photodiode 243 can be connected with the red photodiode 245 via a plug. The plug connected with the red photodiode 245 can be exposed to the upper surface of the epitaxial layer 230. The plugs connecting the blue, green, and red photodiodes 241, 243, and 245 can be formed by implanting n-type impurities during the implantation processes for forming the photodiodes.

According to another embodiment, the blue, green, and red photodiodes 251, 253, and 255 of the photodiode 250 may not be connected with each other within the epitaxial layer 230. Instead, corresponding plugs can be provided that are exposed to the upper surface of the epitaxial layer 230. It should be noted that the structures of the photodiode 240 and 250 are mere examples. Photodiodes formed in respective pixels can be formed having the same structures or different structures depending on design. For example, in an embodiment where the photodiodes have different structures, a first pixel A can be formed with photodiode 240 and an adjacent pixel B can be formed with photodiode 250.

Figure 5:
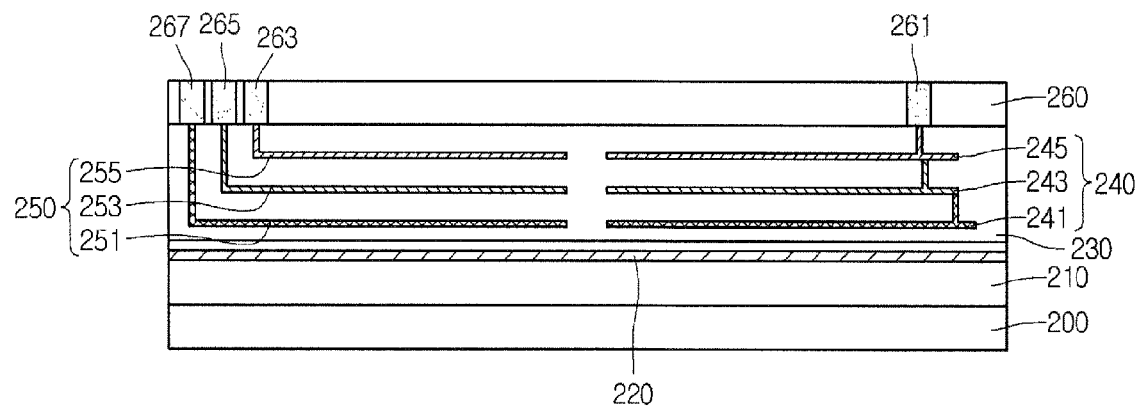

Referring to FIG. 5, an upper interconnection layer can be formed on the second semiconductor substrate 200 including the photodiodes 240 and 250.

The upper interconnection layer can include a dielectric 260, and upper interconnections 261 and 263 (265, 267) passing through the dielectric 260. The dielectric 260 can be formed in a plurality of layers, and a plurality of upper interconnections 261 and 263 (265, 267) can be provided. For example, the dielectric 260 can be an oxide layer or a nitride layer. Also, the upper interconnections 261 and 263 (265, 267) can be formed of various conductive materials including metal, alloy, and silicide. For example, the upper interconnections 261 and 263 (265, 267) can be formed of aluminum, copper, cobalt, or tungsten.

The upper interconnection 261 can be connected with a plug of the photodiode 240. That is, the upper interconnection 261 can be formed on the photodiode 240 to connect to the plug. Also, three upper interconnections 263, 265, and 267 can be formed on the photodiode 250 to connect with the plugs arranged for corresponding photodiodes 251, 253, and 255.

Figure 6:
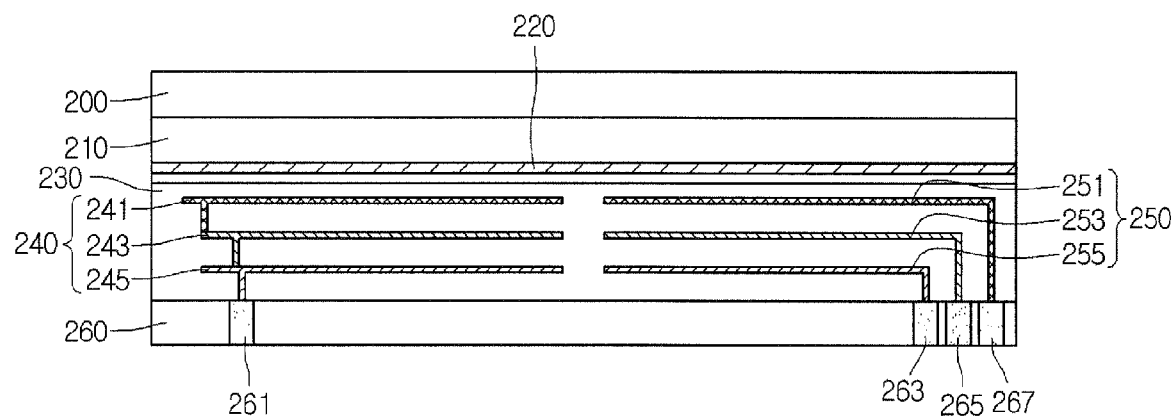

Referring to FIG. 6, the second semiconductor substrate 200 can be flipped in preparation for connection to the first substrate 100.

When the second semiconductor substrate 200 where the upper interconnection layer is rotated by 180°, the lower surface of the second semiconductor substrate 200 faces upward and the upper interconnection layer faces downward.

Therefore, in the photodiode 240 (250), the green photodiode 243 (253) and the blue photodiode 245 (255) are positioned above the red photodiode 241 (251).

Figure 7:
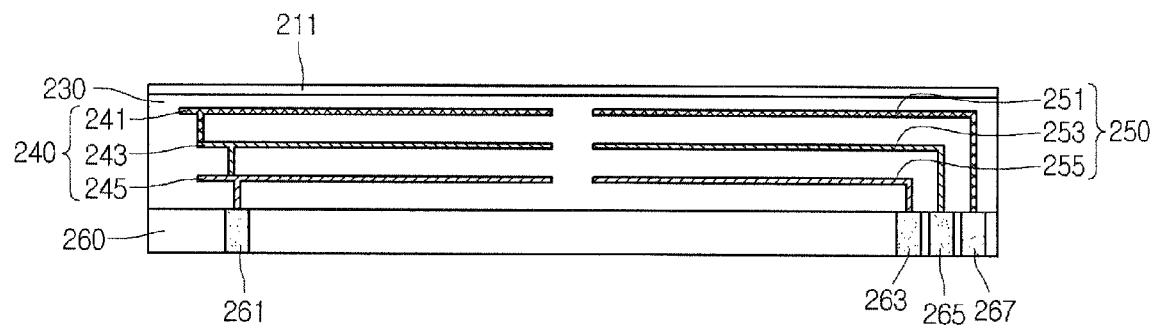

Referring to FIG. 7, a portion of the second semiconductor substrate 200 can be removed.

Accordingly, a second substrate 211 can be formed by performing a chemical mechanical polishing (CMP) process on the surface of the second semiconductor substrate 200. That is, the CMP process can be performed on the surface of the second semiconductor substrate 200 to expose the first epitaxial layer 210. At this point, the barrier layer 220 formed inside the first epitaxial layer 210 can be used as a polishing end point. Afterward, the barrier layer 220 can be removed.

Figure 8:
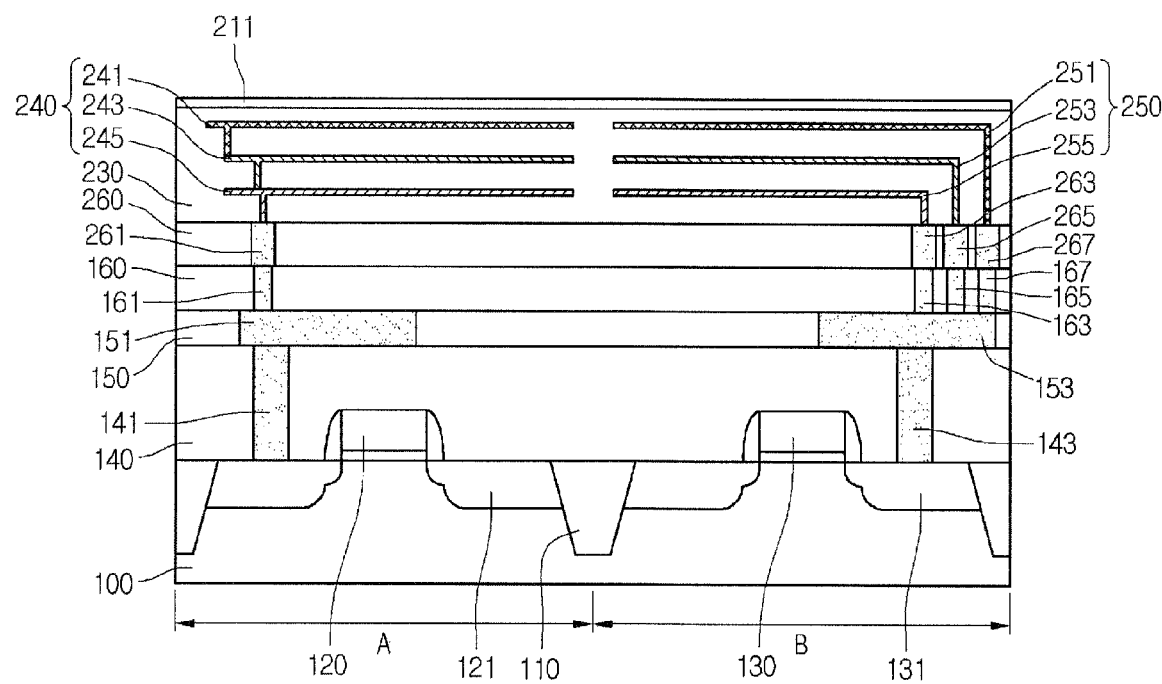

Referring to FIG. 8, the first substrate 100 including the transistors 120 and 130 is connected to the second substrate 211 including the photodiodes 240 and 250.

The first substrate 100 and the second substrate 211 can be connected to each other by a bumping process. That is, bumps formed of gold, solder, or other metals can be formed on the final lower interconnections 161, 163, 165, and 167 of the first substrate 100. Then, the upper interconnections 261, 263, 265, and 267 of the second substrate 211 are positioned on the lower interconnections 161, 163, 165, and 167 of the first substrate 100, and the bumping process can be performed, so that the lower interconnections 161, 163, 165, and 167 of the first substrate 100 and the upper interconnections 261, 263, 265, and 267 of the second substrate 211 are connected to each other.

Therefore, the transistors 120 and 130 of the first substrate 100 are connected with the photodiodes 240 and 250 of the second substrate 211, respectively, so that the unit pixel A and the unit pixel B can be formed.

In realizing the unit pixels as described above, the transistors 120 and 130 and the photodiodes 240 are vertically integrated.

Referring to FIG. 9, in a further embodiment, microlenses 300 can be formed on the second substrate 211.

To form the microlenses 300, material for a lens such as an organic material or an inorganic material can be coated. In one embodiment, the material for the lens can be patterned for each unit pixel, and then a reflow process is performed, so that the dome-shaped microlenses 300 are formed. The microlens 300 can be formed for each unit pixel to condense light to the photodiode 240.

The number of unit pixels for a predetermined area can be increased by disposing the second substrate 211 including the photodiodes 240 and 250 on the first substrate 100 including the transistors 120 and 130.

In addition, light sensitivity can be increased by increasing the surface area of the photodiode in the unit pixel in realizing the unit pixel of the photodiode 240 (250).

Also, according to embodiments, a fill factor can approach to about 100% by vertical integration of the photodiodes 240 and the transistors 120 and 130.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a first substrate comprising a transistor circuit;
   a lower interconnection layer on the first substrate, the lower interconnection layer comprising a lower interconnection electrically connected to the transistor circuit;
   an upper interconnection layer on the lower interconnection layer, the upper interconnection layer comprising an upper interconnection connected with the lower interconnection; and
   a second substrate comprising a vertical type photodiode on the upper interconnection layer, the vertical type photodiode being connected with the upper interconnection;
   wherein the vertical type photodiode comprises:
   a red photodiode, a green photodiode, and a blue photodiode stack;
   a first plug directly connecting the blue photodiode to the green photodiode;
   a second plug directly connecting the green photodiode to the red photodiode; and
   a third plug directly connecting the red photodiode to the upper interconnection.

2. A method for manufacturing an image sensor, the method comprising:
   forming a transistor circuit on a first substrate;
   forming a lower interconnection layer comprising a lower interconnection connected to the transistor circuit on the first substrate;
   forming a vertical type photodiode on a second substrate; and
   connecting the second substrate to the first substrate;
   wherein the forming of the vertical type diode on the second substrate comprises:
   forming a first epitaxial layer on a semiconductor substrate; forming a barrier layer inside the first epitaxial layer; forming a second epitaxial layer on the first epitaxial layer; and forming the vertical type photodiode inside the second epitaxial layer;
   wherein the forming of the second epitaxial layer and the forming of the vertical type photodiode inside the second epitaxial layer comprises:
   forming a primary second epitaxial layer on the first epitaxial layer;
   forming a blue photodiode inside the primary second epitaxial layer;
   forming a secondary second epitaxial layer on the primary second epitaxial layer including the blue photodiode;
   forming a green photodiode in the secondary second epitaxial layer on the blue photodiode;
   forming a tertiary second epitaxial layer on the secondary second epitaxial layer including the green photodiode;
   forming a red photodiode in the tertiary second epitaxial layer on the green photodiode; and
   wherein the forming of the second epitaxial layer and the forming of the vertical type photodiode inside the second epitaxial layer further comprises:
   forming a first plug connecting the blue photodiode to the green photodiode;
   forming a second plug connecting the green photodiode to the red photodiode;
   forming a third plug connecting to the red photodiode and exposed at a surface of the second epitaxial layer; and
   forming an upper interconnection layer comprising an upper interconnection connected to the third contact plug on the second epitaxial layer.

* * * * *